(12) United States Patent
Knipper et al.

(10) Patent No.: US 11,004,700 B2
(45) Date of Patent: May 11, 2021

(54) TEMPORARY POST-ASSISTED EMBEDDING OF SEMICONDUCTOR DIES

(71) Applicant: Infineon Technologies AG, Neubiberg (DE)

(72) Inventors: Richard Knipper, Regensburg (DE); Thorsten Scharf, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/546,913

(22) Filed: Aug. 21, 2019

(65) Prior Publication Data
US 2021/0057234 A1   Feb. 25, 2021

(51) Int. Cl.
| | | |
|---|---|---|
| *H01L 21/56* | (2006.01) | |
| *H01L 23/00* | (2006.01) | |
| *H01L 21/48* | (2006.01) | |
| *H01L 21/78* | (2006.01) | |
| *H01L 23/31* | (2006.01) | |
| *H01L 21/027* | (2006.01) | |

(52) U.S. Cl.
CPC ........ *H01L 21/565* (2013.01); *H01L 21/0274* (2013.01); *H01L 21/4846* (2013.01); *H01L 21/561* (2013.01); *H01L 21/568* (2013.01); *H01L 21/78* (2013.01); *H01L 23/3107* (2013.01); *H01L 24/05* (2013.01); *H01L 2224/02205* (2013.01)

(58) Field of Classification Search
CPC ... H01L 21/565; H01L 21/561; H01L 21/568; H01L 21/4846; H01L 21/0274; H01L 21/78; H01L 23/3107; H01L 2224/02205
See application file for complete search history.

(56) References Cited

U.S. PATENT DOCUMENTS

2016/0223765 A1\* 8/2016 Krabe ................... H01L 33/005
2019/0295858 A1\* 9/2019 Athavale ................ H01L 24/96

\* cited by examiner

*Primary Examiner* — FeiFei Yeung Lopez
(74) *Attorney, Agent, or Firm* — Murphy, Bilak & Homiller, PLLC

(57) ABSTRACT

A method includes: providing a semiconductor die having a first main surface, a second main surface opposite the first main surface, and an edge between the first main surface and the second main surface; applying a temporary spacer to a first part of the first main surface of the semiconductor die, the first part being positioned inward from a peripheral part of the first main surface; after applying the temporary spacer, embedding the semiconductor die at least partly in an embedding material, the embedding material covering the edge and the peripheral part of the first main surface of the semiconductor die and contacting a sidewall of the temporary spacer; and after the embedding, removing the temporary spacer from the first main surface of the semiconductor die to expose the first part of the first main surface of the semiconductor die. A semiconductor device produced by the method is also provided.

23 Claims, 9 Drawing Sheets

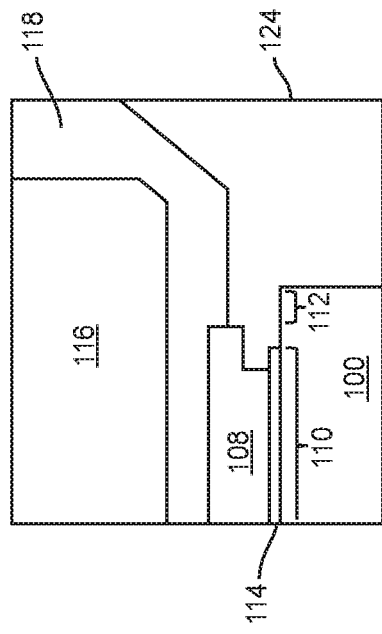
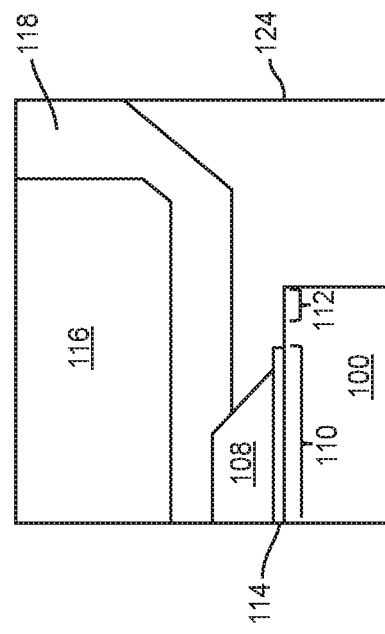
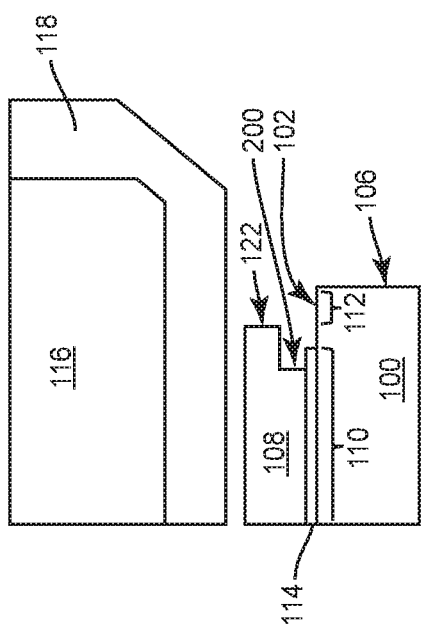
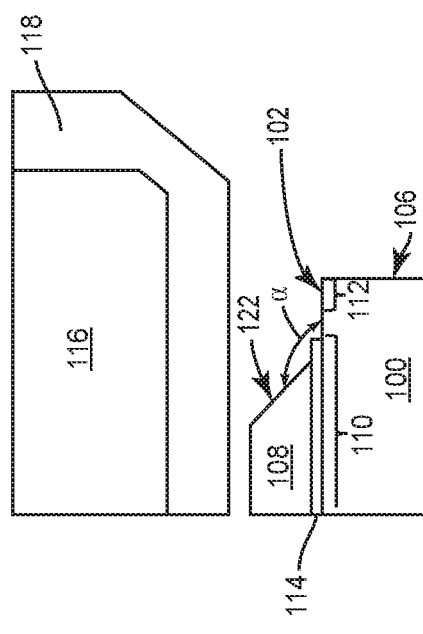
FIG. 2A
FIG. 2B
FIG. 3A
FIG. 3B

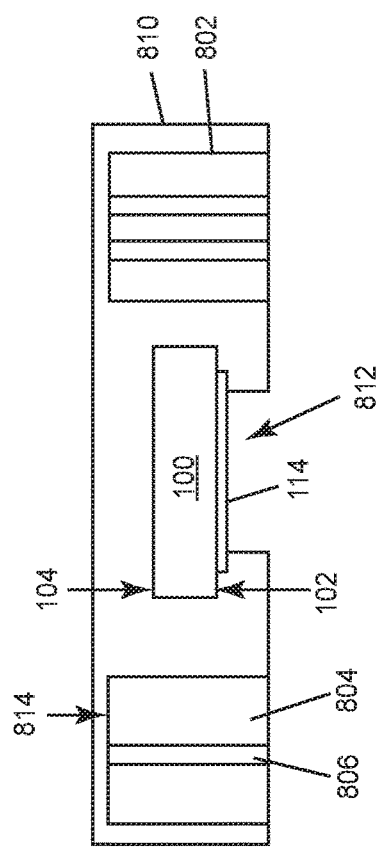
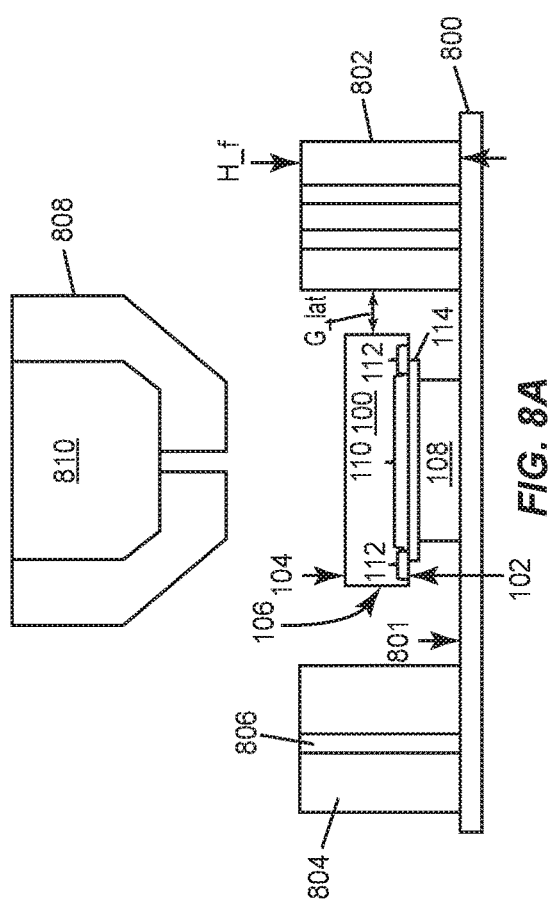
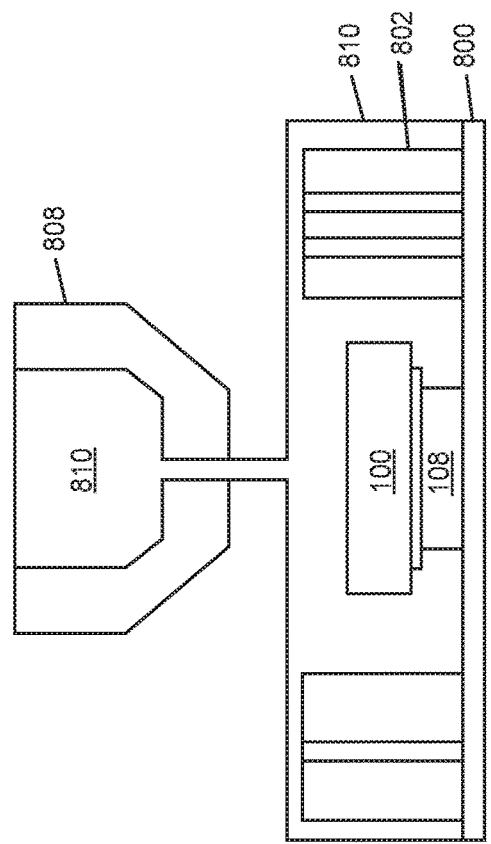
FIG. 8A
FIG. 8B
FIG. 8C

TEMPORARY POST-ASSISTED EMBEDDING OF SEMICONDUCTOR DIES

BACKGROUND

Molding is a standard encapsulation method for semiconductor dies. In many cases, it is preferred to exclude some area of a device from the mold application. This is conventionally done by film assisted molding (FAM). Film assisted molding is a molding process that utilizes a foil that seals an area of the device being encapsulated against unwanted mold. The foil must accommodate height and size tolerances of the device being encapsulated, but also must be pressed against the device with high force to avoid mold flash. These competing requirements result in an expensive compromise and lead to improper edge formation at topographical features of the device being encapsulated. In other cases, it may be necessary to protect features from the high local pressure of the foil and/or topologies which are too small to be formed by a mold stamp covered with a thick foil may be required.

An underfill compound may be applied and/or the size of filler particles contained in the molding compound may be reduced. In both cases, however, reduced mechanical stability and/or isolation problems may result along with reduced long-term stability. Underfill and smaller filler particles also increase the material cost up to 100×. Further, these approaches include exposed imide/Cu plated border areas, possibly causing long-term stability issues due to an undefined interface. Foil assisted molding is not used with these approaches, and hence many products are not possible. In many cases, features are opened after molding which is laborious and can damage underlying structures.

Thus, there is a need for an improved embedding process for semiconductor devices.

SUMMARY

According to an embodiment of a method, the method comprises: providing a semiconductor die having a first main surface, a second main surface opposite the first main surface, and an edge between the first main surface and the second main surface; applying a temporary spacer to a first part of the first main surface of the semiconductor die, the first part being positioned inward from a peripheral part of the first main surface; after applying the temporary spacer, embedding the semiconductor die at least partly in an embedding material, the embedding material covering the edge and the peripheral part of the first main surface of the semiconductor die and contacting a sidewall of the temporary spacer; and after the embedding, removing the temporary spacer from the first main surface of the semiconductor die to expose the first part of the first main surface of the semiconductor die.

According to an embodiment of a method, the method comprises: providing a semiconductor wafer have a plurality of semiconductor dies, each semiconductor die of the plurality of semiconductor dies having a first main surface, a second main surface opposite the first main surface; applying a temporary spacer to a first part of the first main surface of each of the semiconductor dies, the first part being positioned inward from a peripheral part of the first main surface; after applying the temporary spacers, singulating the plurality of semiconductor dies so as to form an edge between the first and second main surface of each die; after the singulating, embedding each of the singulated semiconductor dies at least partly in an embedding material, the embedding material covering the edge and the peripheral part of the first main surface of each of the singulated semiconductor dies and contacting a sidewall of the corresponding temporary spacer; and after the embedding, removing the temporary spacers from the first main surface of the singulated semiconductor dies to expose the first part of the first main surface of the singulated semiconductor dies.

According to an embodiment of a semiconductor device, the semiconductor device comprises: a semiconductor die having a first main surface, a second main surface opposite the first main surface, and an edge between the first main surface and the second main surface; a molding compound covering the edge and a peripheral part of the first main surface of the semiconductor die, the molding compound comprising a resin and filler particles embedded within the resin; and an opening in the molding compound which exposes a first part of the first main surface of the semiconductor die from the molding compound, the first part being positioned inward from the peripheral part, wherein the opening in the molding compound has a sidewall, wherein predominantly all of the filler particles disposed along the sidewall of the opening are fully embedded within the resin and not exposed at all along the sidewall.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B illustrate respective cross-sectional views of another embodiment of an embedding method, during different stages of the method.

FIGS. 3A and 3B illustrate respective cross-sectional views of another embodiment of an embedding method, during different stages of the method.

FIGS. 8A through 8C illustrate respective cross-sectional views of another embodiment of an embedding method, during different stages of the method.

DETAILED DESCRIPTION

The embodiments described herein introduce a temporary spacer as part of a die encapsulation process. The temporary spacer provides adequate clearance to deposit an embedding material such as molding material over the die edge to protect the die passivation which may have been damaged, e.g., during dicing. After the embedding, the temporary spacer is removed to expose the part of the semiconductor die previously covered by the temporary spacer. In some cases, the part of the semiconductor die exposed by removing the temporary spacer may include a metal pad to which a metallization may then be applied.

The use of a temporary spacer adds to the overall thickness without increasing the lateral dimensions of the package. Accordingly, a well-defined area can be excluded from the embedding process and later be used to contact the die. The temporary spacer may be applied in a parallel process at wafer level or panel level, as removing the temporary spacer post embedding can be done in a wet and/or dry chemical process.

Described next are various embodiments of the embedding method and semiconductor devices produced by the embedding method.

FIGS. 1A through 1D illustrate respective cross-sectional views of an embodiment of the embedding method, during different stages of the method. According to the embedding method illustrated in FIGS. 1A through 1D, a closed mold cavity is used as part of a film assisted molding process to implement the embedding method.

Figure 1A:
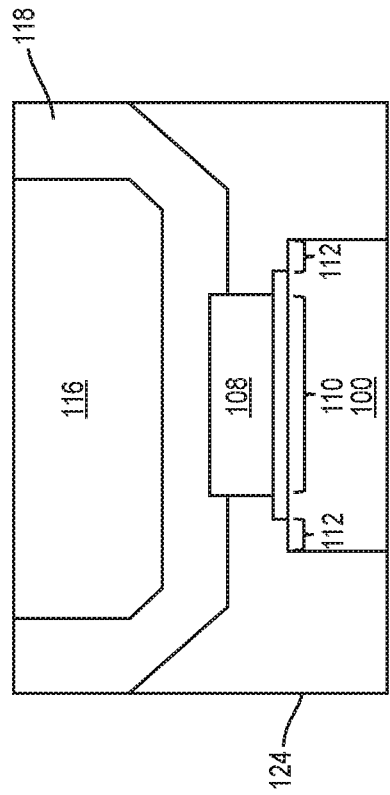
FIGS. 1A through 1D illustrate respective cross-sectional views of an embodiment of an embedding method, during different stages of the method.

FIG. 1A shows a semiconductor die 100 inside the closed mold cavity prior to the embedding. The semiconductor die 100 has a first main surface 102, a second main surface 104 opposite the first main surface 102, and an edge 106 between the first main surface 102 and the second main surface 104. A temporary spacer 108 is applied to a first part 110 of the first main surface 102 of the semiconductor die 100, the first part 110 being positioned inward from a peripheral part 112 of the first main surface 102. The first part 110 of the first main surface 102 of the semiconductor die 100 may include a metal pad 114 such as a contact pad. The spacer 108 is temporary in that the spacer 108 is sacrificial and omitted from the final product. In one embodiment, the first part 110 of the first main surface 102 of the semiconductor die 100 to which the temporary spacer 108 is applied is laterally surrounded by the peripheral part 112 of the first main surface 102.

Figure 1C:
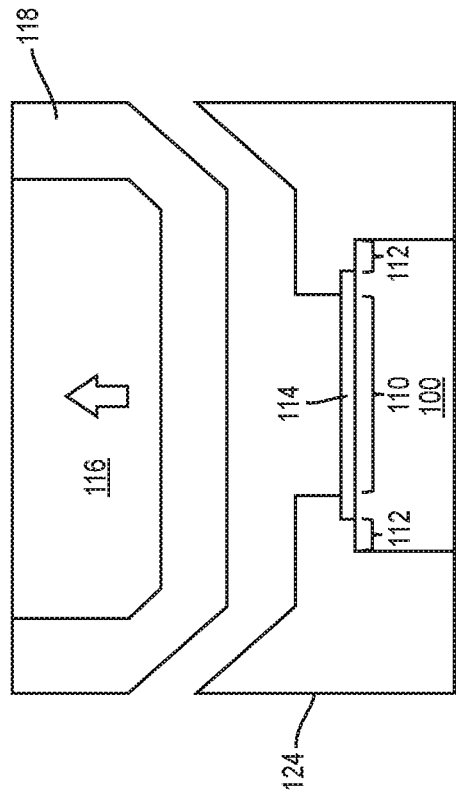
Figure 1B:
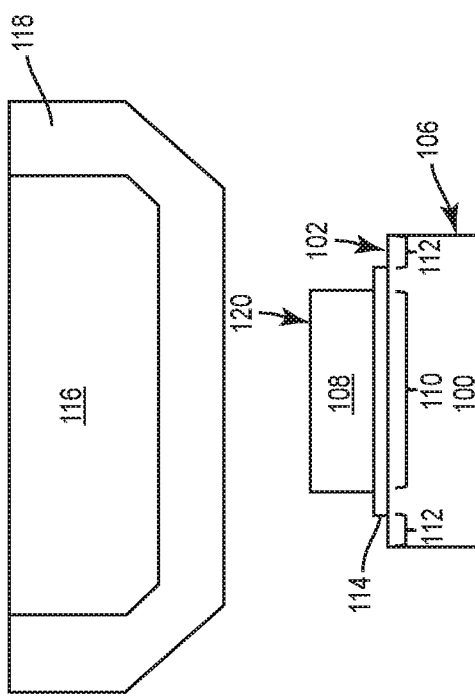

FIG. 1B shows a mold 116 with a foil 118 pressed against the temporary spacer 108 inside the closed mold cavity, as indicated by the downward facing arrow. As a result of the downward pressing of the mold 116, the foil 118 contacts a side 120 of the temporary spacer 108 facing away from the semiconductor die 100 and the foil 118 deforms to a contour of the temporary spacer 108 while leaving a gap 'G' between the foil 118 and the peripheral part 112 of the first main surface 102 of the semiconductor die 100. In the case of a molding compound as the embedding material, if the gap is too small, e.g., less than 70 μm (microns), the molding compound cannot fill the gap reliably. Hence, the gap should be larger than this minimum tolerance to reliably fill the gap with molding compound.

The temporary spacer 108 defines the clearance, and therefore a special molding compound is not needed to ensure the gap is reliably filled. Instead, a molding compound which is less expensive may be used. The temporary spacer 108 also allows for the use of a film 118 of typical thickness, as well. That is, an overly thick film is not necessary. The height of the gap between the foil 118 and the peripheral part 112 of the first main surface 102 of the semiconductor die 100 is well-controlled using the temporary spacer 108. Also, a high deviation in the stack (die plus metal pad) height can be taken up by the foil thickness without jeopardizing proper function of the device. Additionally, not every pad has to be formed in the mold tool separately, reducing the effort for the tool and the requirements towards the foil 118. Further, smaller features can be realized since such features do not have to be formed in the mold tool.

FIG. 1C shows the semiconductor die 100 being at least partly embedded in an embedding material 124, which in this case is a molding compound. Common molding compounds and resins include, but are not limited to, thermoset resins, gel elastomers, encapsulants, potting compounds, composites, optical grade materials, fillers such as $SiO_2$, $Al_2O_3$, MgO, etc. The embedding material 124 covers the edge 106 and the peripheral part 112 of the first main surface 102 of the semiconductor die 100, and contacts a sidewall 122 of the temporary spacer 108. As part of the embedding process, liquefied molding material is forced into the closed mold cavity. The liquefied molding material fills the gap 'G' between the foil 118 and the peripheral part 112 of the first main surface 102 of the semiconductor die 100, and solidifies to form a molding compound.

Figure 1D:
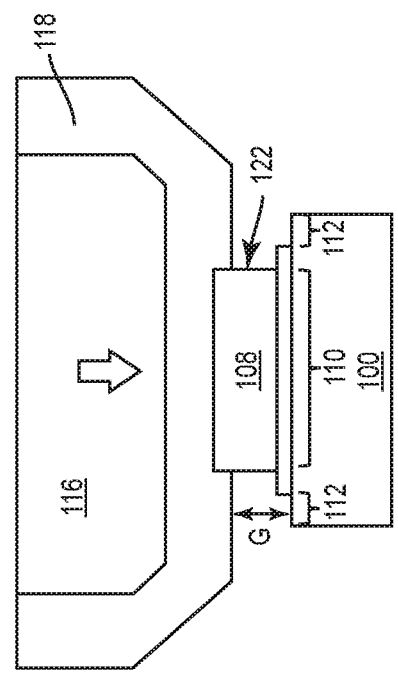

FIG. 1D shows after the embedding. The mold 116 with the foil 118 is retracted away from the molded device, as indicated by the upward facing arrow. The temporary spacer 108 is removed from the first main surface 102 of the semiconductor die 100 to expose the first part 110 of the first main surface 102. In one embodiment, the temporary spacer 108 at least partly covers the metal pad 114 during the embedding process and the metal pad 114 is exposed after the embedding process by removing the temporary spacer 108. A metallization (not shown) such as a Cu metallization may be applied to the exposed metal pad 114, e.g., to provide an electrical connection to the metal pad 114 at the first main surface 102 of the embedded semiconductor die 100.

FIGS. 2A and 2B illustrate respective partial cross-sectional views of another embodiment of the embedding method, during different stages of the method. Like the embedding method illustrated in FIGS. 1A through 1D, a closed mold cavity is used as part of a film assisted molding process to implement the embedding method, where FIG. 2A corresponds to FIG. 1A and FIG. 2B corresponds to FIG. 1C. Different, however, the temporary spacer 108 has an undercut 200 which forms part of the sidewall 122 of the temporary spacer 108. According to this embodiment, the liquefied molding material fills the gap between the foil 118 and the peripheral part 112 of the first main surface 102 of the semiconductor die 100, including the undercut 200.

FIGS. 3A and 3B illustrate respective partial cross-sectional views of another embodiment of the embedding method, during different stages of the method. Like the embedding method illustrated in FIGS. 1A through 1D, a closed mold cavity is used as part of a film assisted molding process to implement the embedding method, where FIG. 3A corresponds to FIG. 1A and FIG. 3B corresponds to FIG. 1C. Different, however, the sidewall 122 of the temporary spacer 108 is sloped to form an angle α which is greater than 90° with respect to the first main surface 102 of the semiconductor die 100.

FIGS. 4A through 4D illustrate respective cross-sectional views of another embodiment of the embedding method, during different stages of the method. According to the embedding method illustrated in FIGS. 4A through 4D, a closed mold cavity is used as part of a film assisted molding process to implement the embedding method.

Figure 4A:
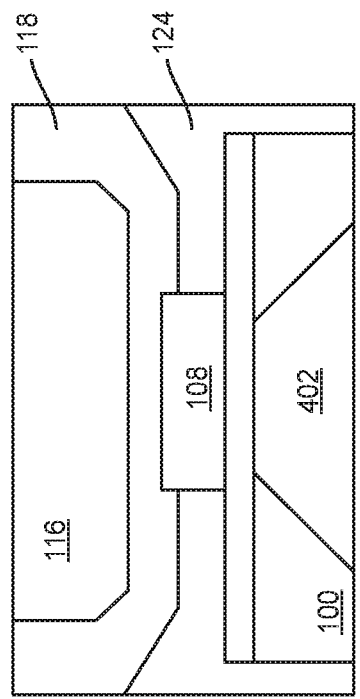
FIGS. 4A through 4D illustrate respective cross-sectional views of another embodiment of an embedding method, during different stages of the method.

FIG. 4A shows a semiconductor die 100 inside the closed mold cavity prior to the embedding process. The semiconductor die 100 has a first main surface 102, a second main surface 104 opposite the first main surface 102, and an edge 106 between the first main surface 102 and the second main surface 104. A temporary spacer 108 is applied to a first part 110 of the first main surface 102 of the semiconductor die 100, the first part 110 being positioned inward from a peripheral part 112 of the first main surface 102. The first part 110 of the first main surface 102 of the semiconductor die 100 comprises a sensor structure 400 according to this embodiment, e.g., a MEMS (micro-electro-mechanical systems) structure. The temporary spacer 108 at least partly covers a first (top) side of the sensor structure 400, to protect the sensor structure 400 during the subsequent embedding process.

An additional temporary spacer 402 may be applied to a second (bottom) side of the sensor structure 400 opposite the first side. The additional temporary spacer 402 at least partly covers the second side of the sensor structure 400 during the subsequent embedding process. Both sides of the sensor structure 400 do not need to be protected in all cases. Protection at only one side of the sensor structure 400 may be sufficient.

Figure 4C:
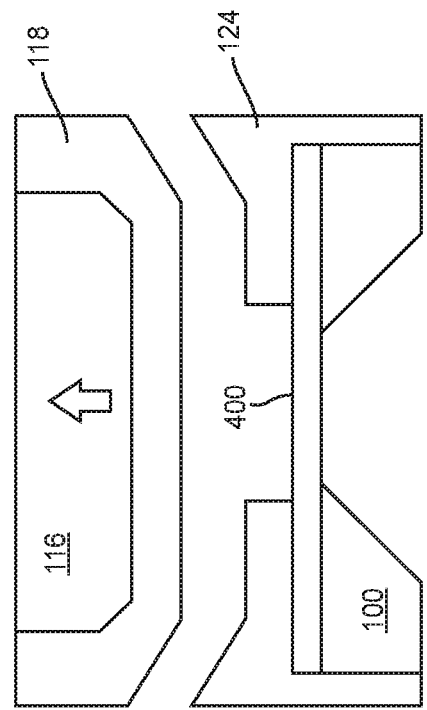
Figure 4B:
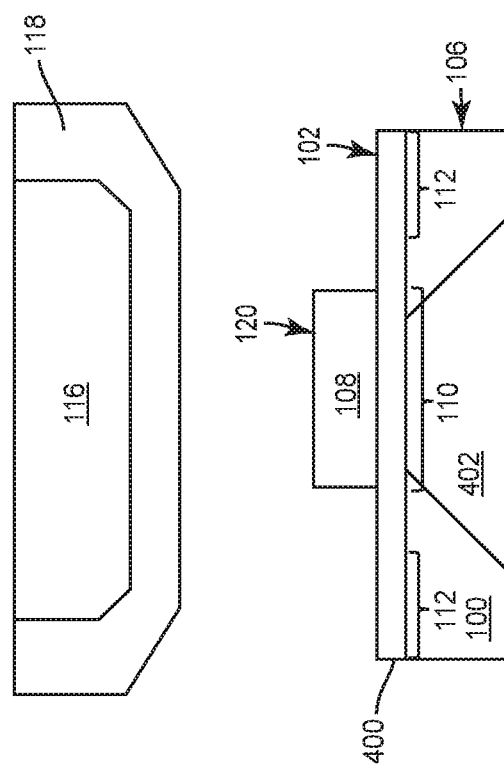

FIG. 4B shows the mold 116 with the foil 118 pressed against the upper temporary spacer 108 inside the closed mold cavity, as indicated by the downward facing arrow. As a result of the downward pressing by the mold 116, the foil 118 contacts a side 120 of the upper temporary spacer 108 facing away from the semiconductor die 100 and the foil 118 deforms to a contour of the upper temporary spacer 108 while leaving a gap 'G' between the foil 118 and the peripheral part 112 of the first main surface 102 of the semiconductor die 100. As explained above in connection with FIG. 1B, the upper temporary spacer 108 defines the clearance so that a sufficiently large gap is provided between the foil 118 and the peripheral part 112 of the first main surface 102 of the semiconductor die 100 to allow for adequate molding in the gap.

FIG. 4C shows the semiconductor die 100 being at least partly embedded in an embedding material 124, which in this case is a molding compound. The molding compound 124 covers the edge 106 and the peripheral part 112 of the first main surface 102 of the semiconductor die 100, and contacts the sidewall 122 of the upper temporary spacer 108. The upper temporary spacer 108 at least partly covers the top side of the sensor structure 400 during the molding process, and the lower temporary spacer 402 at least partly covers the bottom side of the sensor structure 400 during the molding process. As explained above, protection at only one side of the sensor structure 400 may be sufficient and therefore one of the temporary spacers 108, 402 may be omitted.

Figure 4D:
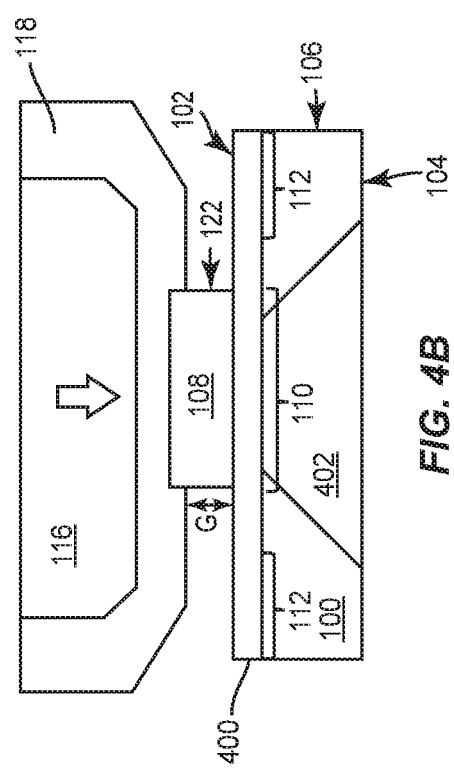

FIG. 4D shows after the embedding. The mold 116 with the foil 118 is retracted away from the molded device, as indicated by the upward facing arrow, and each temporary spacer 108, 402 is removed. The top side of the sensor structure 400 is exposed by removing the upper temporary spacer 108, and the bottom side of the sensor structure 400 is exposed by removing the lower temporary spacer 402.

FIGS. 5A through 5D illustrate respective cross-sectional views of another embodiment of the embedding method, during different stages of the method. According to the embedding method illustrated in FIGS. 5A through 5D, a closed mold cavity is used as part of a film assisted molding process to implement the embedding method.

Figure 5A:
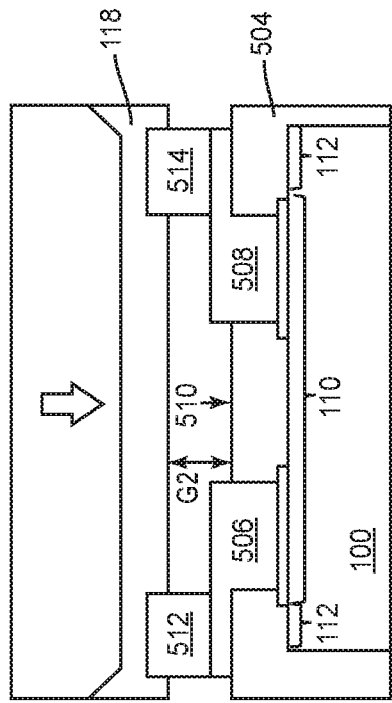
FIGS. 5A through 5D illustrate respective cross-sectional views of another embodiment of an embedding method, during different stages of the method.

FIG. 5A shows a semiconductor die 100 inside the closed mold cavity prior to the embedding process. The semiconductor die 100 has a first main surface 102, a second main surface 104 opposite the first main surface 102, and an edge 106 between the first main surface 102 and the second main surface 104. According to this embodiment, the first part 110 of the first main surface 102 of the semiconductor die 100 includes at least first and second metal pads 500, 502 such as contact pads. A separate temporary spacer 108, 108' is applied to at least part of each metal pad 500, 502 at the first main surface 102 of the semiconductor die 100. Accordingly, each metal pad 500, 502 at the first main surface 102 of the semiconductor die 100 is at least partly covered by a temporary spacer 108, 108' during the embedding process.

Figure 5C:
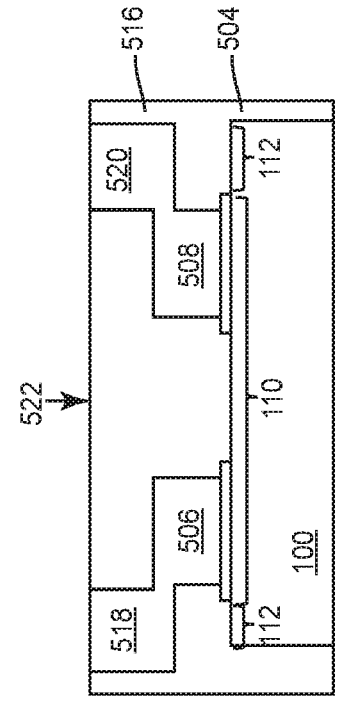
Figure 5B:
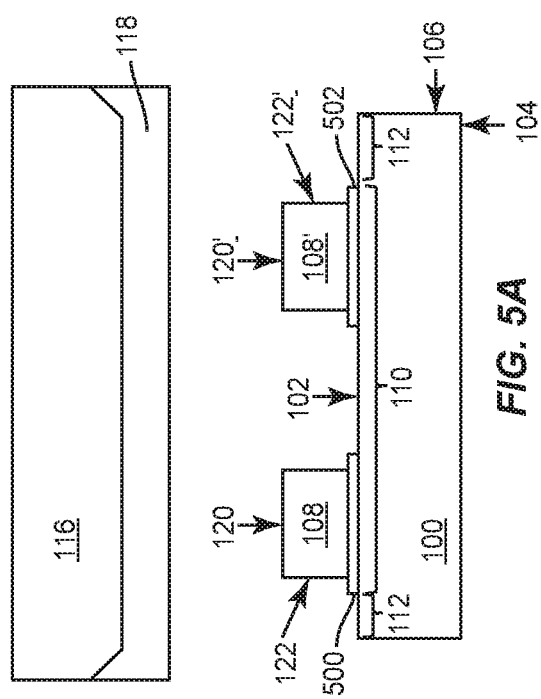

FIG. 5B shows the mold 116 with the foil 118 pressed against the temporary spacers 108, 108' inside the closed mold cavity and the semiconductor die 100 at least partly embedded in a first molding compound 504, as part of a first embedding process. The first molding compound 504 covers the edge 106 and the peripheral part 112 of the first main surface 102 of the semiconductor die 100, and contacts the sidewall 122, 122' of each temporary spacer 108, 108'.

FIG. 5C shows after the first embedding process. The mold 116 with the foil 118 is retracted away from the molded device and each temporary spacer 108, 108' is removed. Removing the temporary spacers 108, 108' after the first embedding process exposes the previously covered metal pads 500, 502 at the first main surface 102 of the semiconductor die 100. A first metallization 506 is then formed on the exposed first metal pad 500 and a second metallization 508 is formed on the exposed second metal pad 502. In one embodiment, the first and second metallizations 506, 508 fill the corresponding holes formed in the first molding compound 504 as a result of removing the temporary spacers 108, 108' after the first embedding process. One or both of the metallizations 506, 508 may extend onto a side 510 of the first molding compound 504, as shown in FIG. 5C.

A new temporary spacer 512 is applied to the first metallization 506, e.g., to a part of the first metallization 506 that may extend onto the side 510 of the first molding compound 504 facing away from the semiconductor die 100. Another new temporary spacer 514 is applied the second metallization 508, e.g., to a part of the second metallization 508 that may extend onto the side 510 of the first molding compound 504 facing away from the semiconductor die 100. The mold 116 with the foil 118 is pressed against the new temporary spacers 512, 514 inside the closed mold cavity, as indicated by the downward facing arrow in FIG. 5C, as part of a second embedding process.

Figure 5D:
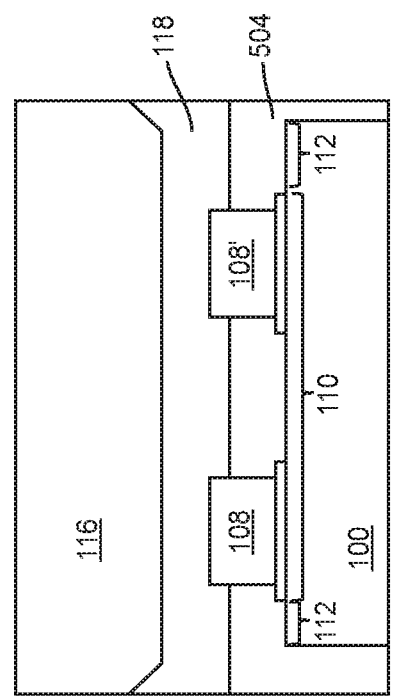

FIG. 5D shows a second molding compound 516 applied to the side 510 of the first molding compound 504 facing away from the semiconductor die 100. As part of the second embedding process, liquefied molding material is forced into the closed mold cavity and fills the gap 'G2' between the foil 118 and the side 510 of the first molding compound 504 facing away from the semiconductor die 100. The liquified molding material solidifies, forming the second molding compound 516. The first and second molding compounds 504, 516 may be of the same or different type of molding compound.

After applying the second molding compound 516, the mold 116 with the foil 118 is retracted away from the molded device and the temporary spacers 512, 514 used as part of the second embedding process are removed to expose the part of the first and second metallizations 506, 508 previously covered by the temporary spacers 512, 514. A third metallization 518 is formed on the exposed part of the first metallization 506, and a fourth metallization 520 is formed on the exposed part of the second metallization 508. In one embodiment, the third and fourth metallizations 518, 520 fill the corresponding holes formed in the second molding compound 516 as a result of removing the temporary spacers 512, 514 after the second embedding process.

The metallizations 506, 508, 518, 520 shown in FIGS. 5C and 5D may be formed outside the closed mold cavity, e.g., in one or more deposition tools such as an electrochemical deposition (ECD) copper plating tool and/or a physical vapour deposition (PVD) tool. One or more of the metallizations 506, 508, 518, 520 may form part of a redistribution layer (RDL). For example, one or more of the metallizations 506, 508, 518, 520 may be used to implement fan-out for a wafer level package. By using temporary spacers 108, 108' on top of the metal pads 500, 502, the molding compound 504 can cover the entire die surface 102 but the metal pads 500, 502. With a sloped spacer design, e.g., as shown in FIGS. 3A-3B, contacts 506, 508, 518, 520 to the metal pads 500, 502 can be formed directly inside the resulting openings formed in the molding compounds 504, 516 by removing the temporary spacers 108, 108', 5121, 514. Hence, a separate opening process such as laser drilling is not needed to form the openings in the molding compounds 504, 516. Optionally, a subsequent planarization process such as CMP (chemical-mechanical polishing) may be used to planarize the top surface 522 of the second molding compound 516.

FIGS. 6A through 6D illustrate respective cross-sectional views of another embodiment of the embedding method, during different stages of the method. According to the embedding method illustrated in FIGS. 6A through 6D, a closed mold cavity is used as part of a film assisted molding process to implement the embedding method.

Figure 6A:
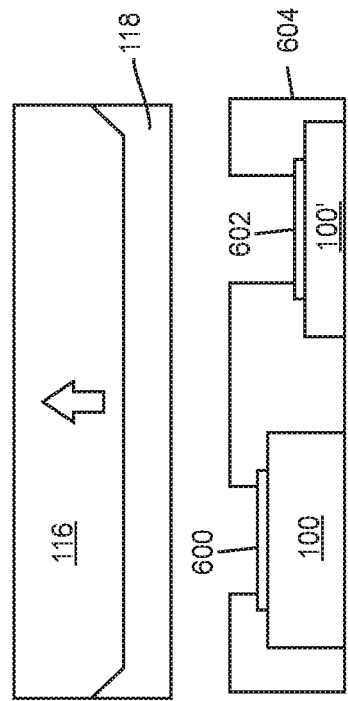
FIGS. 6A through 6D illustrate respective cross-sectional views of another embodiment of an embedding method, during different stages of the method.

FIG. 6A shows at least two semiconductor dies 100, 100' inside the closed mold cavity prior to the embedding. The semiconductor dies 100, 100' each have a first (top) main surface, a second (bottom) main surface opposite the first main surface, and an edge between the first main surface and the second main surface. A first part of the first main surface of each semiconductor die 100, 100' includes a metal pad 600, 602 such as a contact pad. A separate temporary spacer 108, 108' is applied to the metal pad 600, 602 at the first main surface of each semiconductor die 100, 100'. Accordingly, the metal pad 600, 602 at the first main surface of each semiconductor die 100, 100' is at least partly covered by a temporary spacer 108, 108' during the embedding process. The first semiconductor die 100 has a first thickness (Td1) and the second semiconductor die 100' has a second thickness (Td2), where Td1>Td2. The temporary spacers 108, 108' accommodate the height difference (Td1−Td2) between the semiconductor dies 100, 100', so that a combined thickness (Td1+Ts1) of the first semiconductor die 100 and the first temporary spacer 108 is approximately equal to a combined thickness (Td2+Ts2) of the second semiconductor die 100' and the second temporary spacer 108'. Accommodating the height difference between the semiconductor dies 100, 100' would be very difficult to achieve using FAM without the temporary spacers 108, 108'.

Figure 6B:
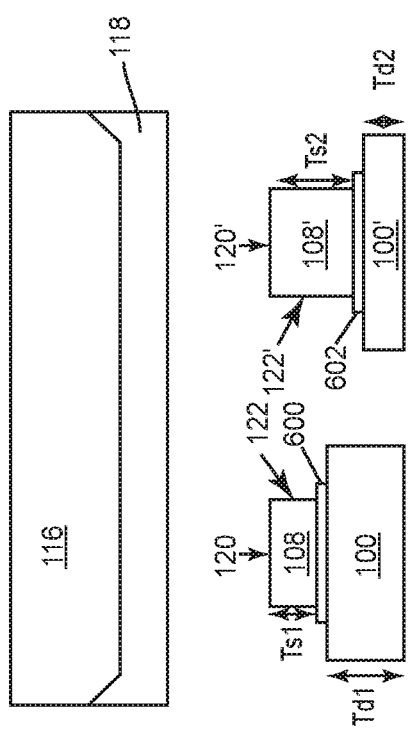

FIG. 6B shows the mold 116 with the foil 118 pressed against the temporary spacers 108, 108' inside the closed mold cavity and each semiconductor die 100, 100' at least partly embedded in a molding compound 604, as part of the embedding process. The foil 118 contacts the side 120, 120' of each temporary spacer 108, 108' facing away from the semiconductor dies 100, 100', and the foil 118 deforms to a contour of the temporary spacers 108, 108' while leaving a gap between the foil 118 and the peripheral part of the first main surface of each semiconductor die 100, 100'. The molding compound 604 covers the edge and the peripheral part of the first main surface of each semiconductor die 108, 108', and contacts a sidewall 122, 122' of each temporary spacer 108, 108', thereby filling the respective gaps. As previously explained herein, the molding compound 604 may be formed by forcing liquefied molding material into the closed mold cavity so that the liquefied molding material fills the gap between the foil 118 and the peripheral part of the first main surface of each semiconductor die 100, 100'.

Figure 6C:
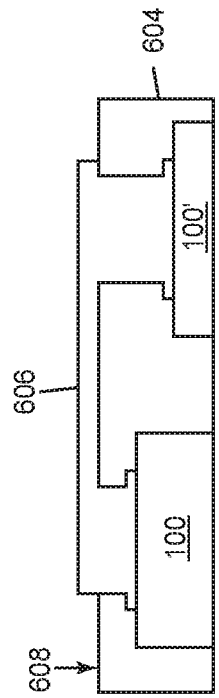

FIG. 6C shows after the first embedding process. The mold 116 with the foil 118 is retracted away from the molded device, as indicated by the upward facing arrow, and each temporary spacer 108, 108' is removed. Removing the temporary spacers 108, 108' after the embedding process exposes the previously covered metal pad 600, 602 at the first main surface of each semiconductor die 100, 100'.

Figure 6D:
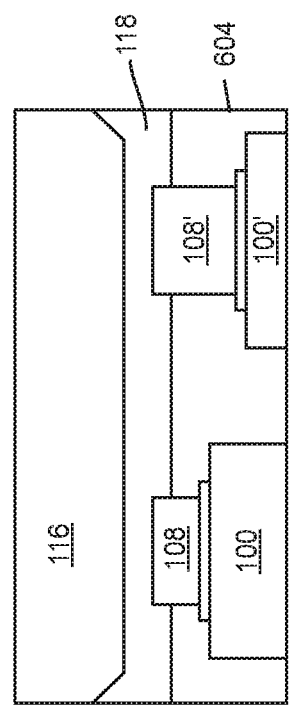

FIG. 6D shows a metallization 606 formed after the temporary spacers 108, 108' are removed and which may extend onto a side 608 of the molding compound 604 facing away from both semiconductor dies 100, 100'. The metallization 606 may be formed, e.g., by electroless plating in the case of Cu metallization. The metallization 606 is connected to the metal pad 600 at the first main surface of the first semiconductor die 100 and to the metal pad 602 at the first main surface of the second semiconductor die 100'. The metallization 606 may electrically connect the metal pads 600, 602 of the different semiconductor dies 100, 100', depending on how the metallization 606 is structured. Electrically connecting the dies 100, 100' via the metallization 606 instead of by using wire bonding increases thermal distribution, reduces resistivity and improves reliability. In addition or separately, the metallization 606 may form part of a redistribution layer.

Figure 7A:
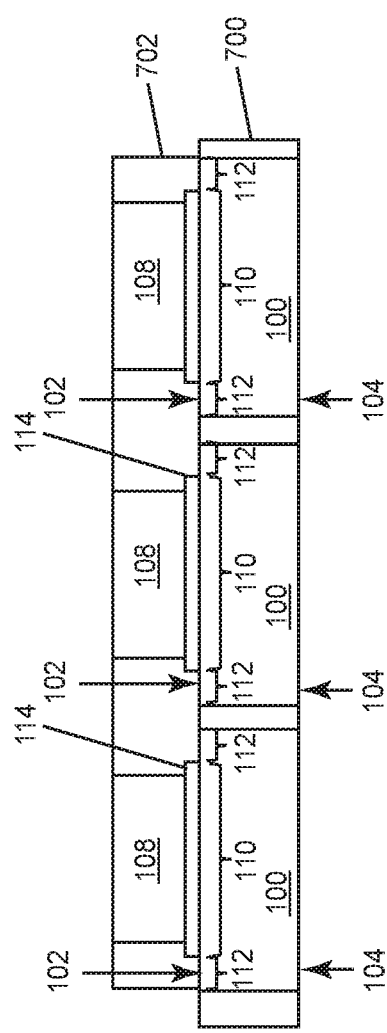
FIGS. 7A and 7B illustrate respective partial cross-sectional views of an embodiment of forming a temporary spacer fur use during an embedding process, during different stages of the method.
Figure 7B:
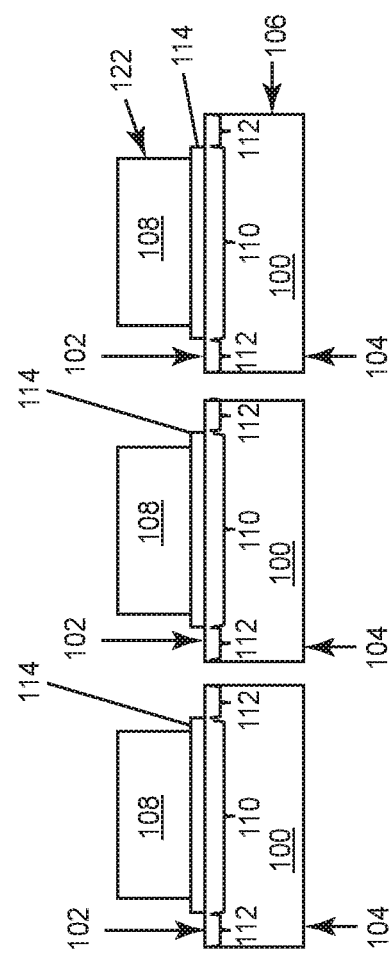

FIGS. 7A and 7B illustrate respective partial cross-sectional views of an embodiment of forming the temporary spacers described herein, during different stages of the process. According to the method illustrated in FIGS. 7A and 7B, the temporary spacers are formed as part of semiconductor wafer processing.

FIG. 7A shows a semiconductor wafer or panel 700 having a plurality of semiconductor dies 100. In the case of a wafer, the semiconductor dies 100 have yet to be singulated. In the case of a panel, the semiconductor dies 100 are already singulated. In either case, each semiconductor die 100 has a first main surface 102 and a second main surface 104 opposite the first main surface 102. A temporary spacer 108 is formed on a first part 110 of the first main surface 102 of each semiconductor die 100, e.g., using a photoresist 702. The first part 110 is positioned inward from a peripheral part 112 of the first main surface 102. The first part 110 of the first main surface 102 of each semiconductor die 100 may include a metal pad 114 such as a contact pad.

FIG. 7B shows that after applying the temporary spacers 108, the semiconductor dies are separated from one another. In the case of a panel 700, a film such as a glue or adhesive may be removed from a carrier to separate the dies 100 or the panel 700 may be diced or cut to separate the semiconductor dies 100 from one another. In the case of a semiconductor wafer 700, the dies 100 may be singulated, e.g., by sawing, laser dicing, electrical discharge machining (EDM), etc. so as to separate the semiconductor dies 108 and form an edge 106 between the first and second main surfaces 102, 104 of each die 100.

Each separate semiconductor die 100 may then be at least partly embedded in an embedding material such as a molding compound, the embedding material covering the edge 106 and the peripheral part 112 of the first main surface 102 of each of semiconductor die 100 and contacting a sidewall 122 of the corresponding temporary spacer 108. The embedding may be performed in accordance with any of the related embodiments described herein. After the embedding, the temporary spacers 108 are removed to expose the first part 110 of the first main surface 102 of each semiconductor die 100, as previously described herein.

FIGS. 8A through 8C illustrate respective cross-sectional views of another embodiment of the embedding method, during different stages of the method. According to the embedding method illustrated in FIGS. 8A through 8C, a closed mold cavity is not used to implement the embedding method.

FIG. 8A shows that before the embedding, a side of the temporary spacer 108 facing away from the semiconductor die 100 is affixed to a surface 801 of a carrier 800 such as a glass carrier, semiconductor wafer, tape, etc. The semiconductor die 100 may be mounted to the carrier 800 in a flip-chip configuration with a front side of the semiconductor die 100 facing the carrier 800, for example. A frame 802 is affixed to the surface 801 of the carrier 800 so that a lateral gap 'G_lat' is present between the frame 802 and the edge 106 of the semiconductor die 100. The frame 802 may comprise an insulating material 804 with electrically conductive vias 806. For example, the frame 802 may be a printed circuit board (PCB). However, other types of frames may be used such as a laminate, ceramic, redistribution layer, etc. More than one semiconductor die 100 may be processed as shown in FIG. 8A using the same carrier 800. This may include more than one semiconductor die 100 being laterally surrounded by the frame 802 and/or multiple semiconductor dies 100 and multiple frames 802 mounted to the same carrier 800.

FIG. 8B shows a dispensing tool 808 for applying an embedding material 810 into the lateral gap between the frame 802 and the edge 106 of the semiconductor die 100. The embedding material 810 may or may not be a molding compound, according to this embodiment. For example, instead of a molding compound, the embedding material 810 may be a resin, a polymer, potting compound, glue, etc. In another embodiment, the dispensing tool 808 may apply the embedding material 810 by printing, jetting, or lamination of a sheet.

FIG. 8C shows the carrier 800 removed from the temporary spacer 108 and the frame 802 after application of the embedding material 810. In the case of a tape carrier, the structure which includes the embedded die 100 and the frame 802 may be lifted or peeled off the carrier 800. One or more metal pads 114 may be disposed at the part 110 of the first surface 102 of the semiconductor die 100 previously covered by the temporary spacer 108, and electrical contacts (not shown) may be formed to such metal pads 114 in the space 812 created by removal of the temporary spacer 108. After removing the carrier 800, a redistribution layer (not shown) may be applied directly to the exposed metal pads 114 of the semiconductor die 100 without requiring an additional dielectric layer, to yield a chip-embedding package. In one embodiment, the frame 802 has a height (H_f) greater than a combined height of the semiconductor die 100 and the temporary spacer 108, and wherein the embedding material 810 covers the second main surface 104 of the semiconductor die 100 and a side 814 of the frame 802 facing the same direction as the second main surface 104 of the semiconductor die 100.

In each of the embedding embodiments described herein, the temporary spacers are removed after the corresponding die is at least partly embedded in an embedding material. That is, the spacers are temporary in that the spacers are sacrificial and omitted from the final product. Any material that is compatible with semiconductor wafer or die processing and can withstand the parameters (e.g. temperature, pressure, etc.) of the embedding process may be used to form the temporary spacers. For example, the temporary spacers may be made of a photoresist. Photoresists are compatible with semiconductor wafer processing. Another material that may be used for the temporary spacers is magnesium oxide or other oxides, which are dissolvable after the embedding process. Typical polymers may be used as the temporary spacers, and may be formed by inkjet printing. For example, an ultraviolet (UV) curable ink or hot melt glue may be inkjet printed onto a semiconductor die or wafer to form temporary spacers. Further material examples for the temporary spacers are high-temp polymers, composite thermosetting plastics such as duroplast, and elastomers.

Figures 9A, 9B, 9C:
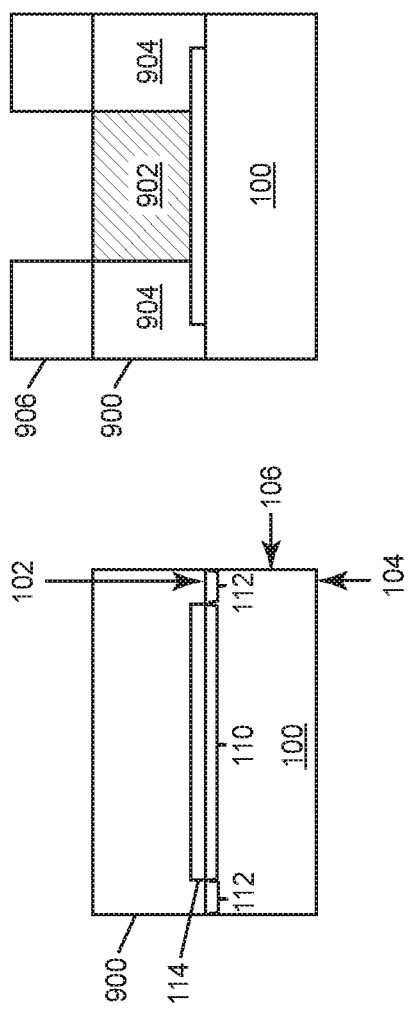
FIGS. 9A through 9C illustrate respective partial cross-sectional views of an embodiment of forming a photoresist-based temporary spacer on a semiconductor die, during different stages of the method.

FIGS. 9A through 9C illustrate respective partial cross-sectional views of an embodiment of forming a photoresist-based temporary spacer on a semiconductor die, during different stages of the process. While a single semiconductor die is shown for ease of illustration, multiple semiconductor dies may be processed in parallel, e.g., as part of a semiconductor wafer before or after singulation or as part of a panel of singulated dies.

FIG. 9A shows a photoresist 900 applied to a first main surface 102 of a semiconductor die 100, e.g., by spin coating, spray coating, dip coating, lamination, etc. The photoresist 900 is a light-sensitive polymer. The lateral accuracy of the process used to form the temporary spacer is defined by the resist process, which is very high. As such, an opening formed in an embedding material by removal of a photoresist-based temporary spacer may be accurately located over the die pads 114 and require much less safety (tolerance) distance to compensate for process deviations.

Any photoresist typically used in semiconductor wafer or die processing may be used. In one embodiment, the photoresist SU-8 is used. SU-8 can withstand temperatures up to 300 to 400 degrees, which is suitable for typical molding processes. A different photoresist may be chosen to fit other requirements.

FIG. 9B shows the photoresist 900 after exposure to light, so that a first region 902 of the photoresist 900 covering the first part 110 of the first main surface 102 of the semiconductor die 100 becomes insoluble and a second region 904 of the photoresist 900 covering the peripheral part 112 of the first main surface 102 of the semiconductor die 100 remains soluble. A patterned mask 906 may be used to block the light, so that only unmasked regions 904 of the photoresist 900 are exposed to light.

In the case of a positive photoresist, the photosensitive material of the photoresist 900 is degraded by light and a developer dissolves away the regions that were exposed to light, leaving behind a coating where the mask 906 was placed. In the case of a negative photoresist, the photosensitive material of the photoresist 900 is strengthened (polymerized or cross-linked) by light, and a developer dissolves away only the regions that were not exposed to light, leaving behind a coating in areas where the mask 906 was not placed.

Different spacer geometries can be realized based on the manner in which the photoresist 900 is processed. For example, the photoresist 900 may be exposed so that the insoluble region 902 of the photoresist 900 has a sloped sidewall which forms the sidewall of the temporary spacer, e.g., as shown in FIGS. 3A and 3B. Such a sloped resist sidewall may yield an undercut in an embedding material. The photoresist 900 may instead include a first photoresist layer formed on the first main surface 102 of the semiconductor die 100 and a second photoresist layer formed on the first photoresist layer. The first and second photoresist layers may be exposed differently so that the insoluble region 902 of the photoresist 900 has an undercut which forms part of the sidewall of the temporary spacer, e.g., as shown in FIGS. 2A and 2B. The sidewall of the temporary spacer instead may be vertical or nearly vertical with respect to the first main surface 102 of the semiconductor die 100, as shown in FIG. 9B.

In the case of processing an entire semiconductor wafer, the photoresist 900 is applied to the first main surface 102 of each die 100 prior to singulating the wafer. As explained above, the photoresist 900 is exposed so that a first region 902 of the photoresist 900 covering the first part 110 of the first main surface 102 of each semiconductor die 100 on the wafer is insoluble and a second region 904 of the photoresist 900 covering the peripheral part 112 of the first main surface 102 of each semiconductor die 100 is soluble in the respective solvent which is usually not water.

FIG. 9C shows the semiconductor die 100 after the soluble region 904 of the photoresist 900 is removed from the peripheral part 112 of the first main surface 102 of the semiconductor die 100 by a suitable developer. The remaining insoluble region 902 of the photoresist 900 forms a temporary spacer. After the embedding process is complete, the temporary spacer formed by the insoluble region 902 of the photoresist 900 may be removed by a suitable stripper.

The resulting semiconductor device produced in accordance with the methods described herein includes an embedding material such as a molding compound or other type of embedding material which covers the edge and a peripheral part of the first main surface of a semiconductor die. In the specific case of a molding compound as the embedding material, the molding compound may include a resin and filler particles embedded within the resin. The molding compound has an opening formed by removing the temporary spacer, which exposes a first part of the first main surface of the semiconductor die from the molding compound. This opening in the molding compound has a sidewall. Again in the case of a molding compound as the embedding material and which includes filler particles embedded within a resin, predominantly all of the filler particles disposed along the sidewall of the opening are fully embedded within the resin and not exposed at all along the sidewall. That is, most of the filler particles along the sidewall of the opening are almost completely covered, like spheres touching a wall. Also, different interaction layers are present at the surfaces which are different from the interaction with the resist at the sides and the foil at the top.

Figure 10C:
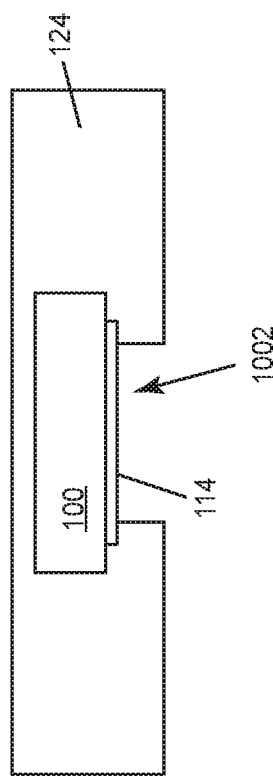
FIGS. 10A through 10O illustrate respective cross-sectional views of another embodiment of an embedding method, during different stages of the method.
Figure 10A:
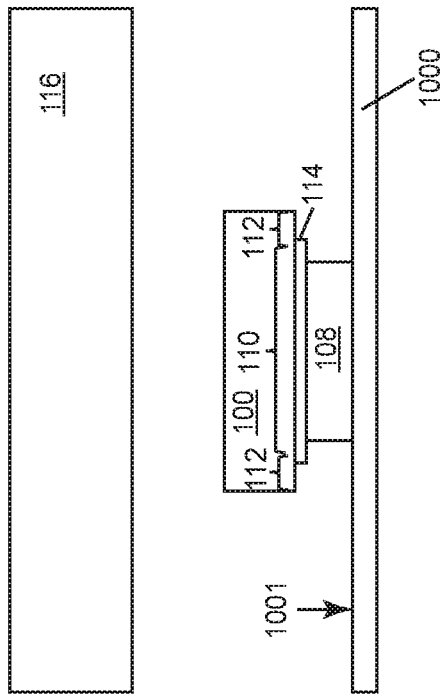

FIGS. 10A through 10O illustrate respective cross-sectional views of another embodiment of the embedding method, during different stages of the method. According to the embedding method illustrated in FIGS. 10A through 10O, a mold tool is to implement the embedding method, but without the foil 118. Hence, this embodiment does not use FAM.

FIG. 10A shows that before the embedding, a side of the temporary spacer 108 facing away from the semiconductor die 100 is affixed to a surface 1001 of a temporary carrier 1000 such as a glass carrier, semiconductor wafer, tape, foil, etc. The semiconductor die 100 may be mounted to the temporary carrier 1000 in a flip-chip configuration with a front side of the semiconductor die 100 facing the temporary carrier 1000, for example. More than one semiconductor die 100 may be processed as shown in FIG. 10A using the same temporary carrier 1000. This may include more than one semiconductor die 100 affixed to the same temporary carrier 1000.

Figure 10B:
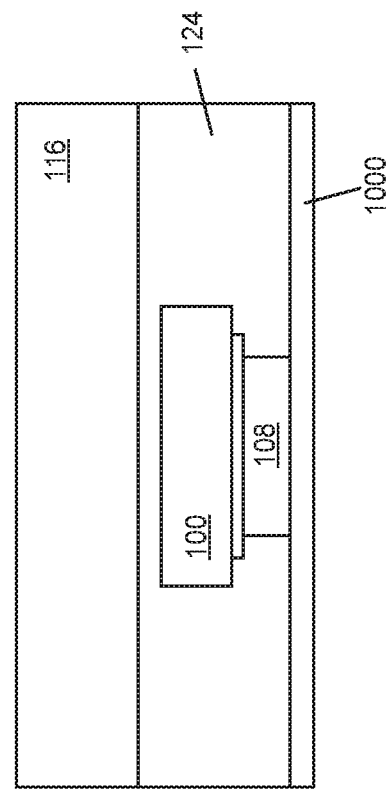

FIG. 10B shows the semiconductor die 100 embedded in an embedding material 124 using a mold 116 but without the foil 118. The embedding material 124 is a molding compound, according to this embodiment.

FIG. 10O shows the molded package after the temporary carrier 1000 and the temporary spacer 108 are removed. The temporary carrier 1000 is removed to allow for removal of the temporary spacer. In the case of a tape carrier, the structure which includes the embedded die 100 may be lifted or peeled off the temporary carrier 1000. One or more metal pads 114 may be exposed at the part 110 of the first surface 102 of the semiconductor die 100 by removing the temporary spacer 108, and electrical contacts (not shown) may be formed to such metal pads 114 in the space 1002 created by removal of the temporary spacer 108. For example, a redistribution layer (not shown) may be applied directly to the exposed metal pads 114 of the semiconductor die 100 without requiring an additional dielectric layer, to yield a chip-embedding package.

Although the present disclosure is not so limited, the following numbered examples demonstrate one or more aspects of the disclosure.

Example 1. A method, comprising: providing a semiconductor die having a first main surface, a second main surface opposite the first main surface, and an edge between the first main surface and the second main surface; applying a temporary spacer to a first part of the first main surface of the semiconductor die, the first part being positioned inward from a peripheral part of the first main surface; after applying the temporary spacer, embedding the semiconductor die at least partly in an embedding material, the embedding material covering the edge and the peripheral part of the first main surface of the semiconductor die and contacting a sidewall of the temporary spacer; and after the embedding, removing the temporary spacer from the first main surface of the semiconductor die to expose the first part of the first main surface of the semiconductor die Example 2. The method of example 1, further comprising: before the embedding, affixing a side of the temporary spacer facing away from the semiconductor die to a surface of a carrier; and affixing a frame to the surface of the carrier so that a gap is present between the frame and the edge of the semiconductor die.

Example 3. The method of example 2, wherein the embedding comprises: applying the embedding material into the gap between the frame and the edge of the semiconductor die; and after the applying, removing the carrier from the temporary spacer and the frame.

Example 4. The method of example 3, wherein the frame has a height greater than a combined height of the semiconductor die and the temporary spacer, and wherein the embedding material covers the second main surface of the semiconductor die and a side of the frame facing a same direction as the second main surface of the semiconductor die.

Example 5. The method of any of examples 1 through 4, wherein the first main surface of the semiconductor die includes a metal pad, wherein the temporary spacer at least partly covers the metal pad during the embedding, and wherein the metal pad is exposed after the embedding by removing the temporary spacer.

Example 6. The method of example 5, further comprising: applying a first additional temporary spacer to an additional metal pad at the first main surface of the semiconductor die, the first additional temporary spacer at least partly covering the additional metal pad during the embedding; after the embedding, removing the first additional temporary spacer from the additional metal pad of the semiconductor die to expose the additional metal pad; and forming a first metallization on the exposed metal pad and a second metallization on the exposed additional metal pad.

Example 7. The method of example 6, further comprising: applying a second additional temporary spacer to the first metallization, and a third additional temporary spacer to the second metallization; after applying the second and the third temporary spacers, applying an additional embedding material to the side of the embedding material facing away from the semiconductor die; after applying the additional embedding material, removing the second and the third temporary spacers to expose the part of the first metallization previously covered by the second temporary spacer and to expose the part of the second metallization previously covered by the third temporary spacer; and forming a third metallization on the exposed part of the first metallization, and a fourth metallization on the exposed part of the second metallization.

Example 8. The method of any of examples 1 through 7, wherein applying the temporary spacer comprises: applying a photoresist to the first main surface of the semiconductor die; exposing the photoresist so that a first region of the photoresist covering the first part of the first main surface of the semiconductor die is insoluble and a second region of the photoresist covering the peripheral part of the first main surface of the semiconductor die is soluble; and removing the soluble part of the photoresist from the peripheral part of the first main surface of the semiconductor die.

Example 9. The method of example 8, wherein the photoresist is exposed so that the insoluble part of the photoresist has a sloped sidewall which forms the sidewall of the temporary spacer, or wherein the photoresist comprises a first photoresist layer on the first main surface of the semiconductor die and a second photoresist layer on the first photoresist layer, and wherein the first and the second photoresist layers are exposed differently so that the insoluble part of the photoresist has an undercut which forms part of the sidewall of the temporary spacer.

Example 10. The example of any of examples 1 and 5-9, further comprising: before the embedding, affixing a side of the temporary spacer facing away from the semiconductor die to a surface of a temporary carrier; and after the embedding, removing the temporary carrier to expose the temporary spacer for removal, wherein the embedding material is a molding compound and the embedding is done using a mold without a foil.

Example 11. The method of any of examples 1 through 10, wherein the embedding comprises: in a closed mold cavity, pressing a mold with a foil against the temporary spacer so that the foil contacts a side of the temporary spacer facing away from the semiconductor die and the foil deforms to a contour of the temporary spacer while leaving a gap between the foil and the peripheral part of the first main surface of the semiconductor die; and subsequently forcing liquefied molding material into the closed mold cavity, the liquefied molding material filling the gap between the foil and the peripheral part of the first main surface of the semiconductor die.

Example 12. The method of any of examples 1 through 11, wherein the first part of the first main surface of the semiconductor die comprises a sensor structure, wherein the temporary spacer at least partly covers a first side of the sensor structure during the embedding, and wherein the first side of the sensor structure is exposed after the embedding by removing the temporary spacer.

Example 13. The method of example 12, further comprising: applying an additional temporary spacer to a second side of the sensor structure opposite the first side, the additional temporary spacer at least partly covering the second side of the sensor structure during the embedding; and after the embedding, removing the additional temporary spacer from the second side of the sensor structure to expose the second side of the sensor structure.

Example 14. The method of any of examples 1 through 13, further comprising: providing an additional semiconductor die having a first main surface, a second main surface opposite the first main surface, and an edge between the first main surface and the second main surface; applying an additional temporary spacer to a first part of the first main surface of the additional semiconductor die, the first part being positioned inward from a peripheral part of the first main surface, wherein the additional semiconductor die has a different thickness than the semiconductor die, wherein the temporary spacer and the additional temporary spacer accommodate the height difference between the additional semiconductor die and the semiconductor die, so that a combined thickness of the semiconductor die and the temporary spacer is approximately equal to a combined thickness of the additional semiconductor die and the additional temporary spacer.

Example 15. The method of example 14, wherein the embedding comprises: in a closed mold cavity, pressing a mold with a foil against both temporary spacers, so that the foil contacts a side of both temporary spacers facing away from both semiconductor dies, and so that the foil deforms to a contour of both temporary spacers while leaving a gap between the foil and the peripheral part of the first main surface of both semiconductor dies; and subsequently forcing liquefied molding material into the closed mold cavity, the liquefied molding material filling the gap between the foil and the peripheral part of the first main surface of both semiconductor dies.

Example 16. The method of example 15, further comprising: after the embedding, removing the additional temporary spacer from the first main surface of the additional semiconductor die to expose the first part of the first main surface of the additional semiconductor die; and after removing both temporary spacers, forming a metallization which extends onto a side of the embedding material facing away from both semiconductor dies and is connected to the first part of the first main surface of the semiconductor die and to the first part of the first main surface of the additional semiconductor die.

Example 17. A method, comprising: providing a semiconductor wafer have a plurality of semiconductor dies, each semiconductor die of the plurality of semiconductor dies having a first main surface, a second main surface opposite the first main surface; applying a temporary spacer to a first part of the first main surface of each of the semiconductor dies, the first part being positioned inward from a peripheral part of the first main surface; after applying the temporary spacers, singulating the plurality of semiconductor dies so as to separate the semiconductor dies and form an edge between the first and second main surface of each singulated die; after the singulating, embedding each of the singulated semiconductor dies at least partly in an embedding material, the embedding material covering the edge and the peripheral part of the first main surface of each of the singulated semiconductor dies and contacting a sidewall of the corresponding temporary spacer; and after the embedding, removing the temporary spacers from the first main surface of the singulated semiconductor dies to expose the first part of the first main surface of the singulated semiconductor dies.

Example 18. The method of example 17, wherein applying the temporary spacers comprises: prior to the singulating, applying a photoresist to the first main surface of the plurality of semiconductor dies; exposing the photoresist so that a first region of the photoresist covering the first part of the first main surface of each of the semiconductor dies is insoluble and a second region of the photoresist covering the peripheral part of the first main surface of each of the semiconductor dies is soluble; and removing the soluble part of the photoresist from the peripheral part of the first main surface of each of the semiconductor dies.

Example 19. A semiconductor device, comprising: a semiconductor die having a first main surface, a second main surface opposite the first main surface, and an edge between the first main surface and the second main surface; a molding compound covering the edge and a peripheral part of the first main surface of the semiconductor die, the molding compound comprising a resin and filler particles embedded within the resin; and an opening in the molding compound which exposes a first part of the first main surface of the semiconductor die from the molding compound, the first part being positioned inward from the peripheral part, wherein the opening in the molding compound has a sidewall, wherein predominantly all of the filler particles disposed along the sidewall of the opening are fully embedded within the resin and not exposed at all along the sidewall.

Example 20. The semiconductor device of example 19, wherein a metal pad of the semiconductor die is exposed from the molding compound by the opening, and wherein a metallization is formed on the exposed part of the metal pad.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   providing a semiconductor die having a first main surface, a second main surface opposite the first main surface, and an edge between the first main surface and the second main surface;
   applying a temporary spacer to a first part of the first main surface of the semiconductor die, the first part being positioned inward from a peripheral part of the first main surface;
   after applying the temporary spacer, embedding the semiconductor die at least partly in an embedding material, the embedding material covering the edge and the peripheral part of the first main surface of the semiconductor die and contacting a sidewall of the temporary spacer;
   before the embedding, affixing a side of the temporary spacer facing away from the semiconductor die to a surface of a carrier and affixing a frame to the surface of the carrier so that a gap is present between the frame and the edge of the semiconductor die; and
   after the embedding, removing the temporary spacer from the first main surface of the semiconductor die to expose the first part of the first main surface of the semiconductor die.

2. The method of claim 1, wherein the embedding comprises:
   applying the embedding material into the gap between the frame and the edge of the semiconductor die; and
   after the applying, removing the carrier from the temporary spacer and the frame.

3. The method of claim 2, wherein the frame has a height greater than a combined height of the semiconductor die and the temporary spacer, and wherein the embedding material covers the second main surface of the semiconductor die and a side of the frame facing a same direction as the second main surface of the semiconductor die.

4. The method of claim 1, wherein the first main surface of the semiconductor die includes a metal pad, wherein the temporary spacer at least partly covers the metal pad during the embedding, and wherein the metal pad is exposed after the embedding by removing the temporary spacer.

5. The method of claim 4, further comprising:
   applying a first additional temporary spacer to an additional metal pad at the first main surface of the semiconductor die, the first additional temporary spacer at least partly covering the additional metal pad during the embedding;
   after the embedding, removing the first additional temporary spacer from the additional metal pad of the semiconductor die to expose the additional metal pad; and
   forming a first metallization on the exposed metal pad and a second metallization on the exposed additional metal pad.

6. The method of claim 5, further comprising:
   applying a second additional temporary spacer to the first metallization, and a third additional temporary spacer to the second metallization;
   after applying the second and the third temporary spacers, applying an additional embedding material to the side of the embedding material facing away from the semiconductor die;
   after applying the additional embedding material, removing the second and the third temporary spacers to expose the part of the first metallization previously covered by the second temporary spacer and to expose the part of the second metallization previously covered by the third temporary spacer; and forming a third metallization on the exposed part of the first metallization, and a fourth metallization on the exposed part of the second metallization.

7. The method of claim 1, wherein applying the temporary spacer comprises:

applying a photoresist to the first main surface of the semiconductor die;

exposing the photoresist so that a first region of the photoresist covering the first part of the first main surface of the semiconductor die is insoluble and a second region of the photoresist covering the peripheral part of the first main surface of the semiconductor die is soluble; and removing the soluble part of the photoresist from the peripheral part of the first main surface of the semiconductor die.

8. The method of claim 7, wherein the photoresist is exposed so that the insoluble part of the photoresist has a sloped sidewall which forms the sidewall of the temporary spacer, or wherein the photoresist comprises a first photoresist layer on the first main surface of the semiconductor die and a second photoresist layer on the first photoresist layer, and wherein the first and the second photoresist layers are exposed differently so that the insoluble part of the photoresist has an undercut which forms part of the sidewall of the temporary spacer.

9. The method of claim 1, wherein the embedding comprises:

in a closed mold cavity, pressing a mold with a foil against the temporary spacer so that the foil contacts a side of the temporary spacer facing away from the semiconductor die and the foil deforms to a contour of the temporary spacer while leaving a gap between the foil and the peripheral part of the first main surface of the semiconductor die; and subsequently forcing liquefied molding material into the closed mold cavity, the liquefied molding material filling the gap between the foil and the peripheral part of the first main surface of the semiconductor die.

10. The method of claim 1, wherein the first part of the first main surface of the semiconductor die comprises a sensor structure, wherein the temporary spacer at least partly covers a first side of the sensor structure during the embedding, and wherein the first side of the sensor structure is exposed after the embedding by removing the temporary spacer.

11. The method of claim 10, further comprising:

applying an additional temporary spacer to a second side of the sensor structure opposite the first side, the additional temporary spacer at least partly covering the second side of the sensor structure during the embedding; and after the embedding, removing the additional temporary spacer from the second side of the sensor structure to expose the second side of the sensor structure.

12. The method of claim 1, further comprising:

providing an additional semiconductor die having a first main surface, a second main surface opposite the first main surface, and an edge between the first main surface and the second main surface;

applying an additional temporary spacer to a first part of the first main surface of the additional semiconductor die, the first part being positioned inward from a peripheral part of the first main surface, wherein the additional semiconductor die has a different thickness than the semiconductor die, wherein the temporary spacer and the additional temporary spacer accommodate the height difference between the additional semiconductor die and the semiconductor die, so that a combined thickness of the semiconductor die and the temporary spacer is approximately equal to a combined thickness of the additional semiconductor die and the additional temporary spacer.

13. The method of claim 12, wherein the embedding comprises:

in a closed mold cavity, pressing a mold with a foil against both temporary spacers, so that the foil contacts a side of both temporary spacers facing away from both semiconductor dies, and so that the foil deforms to a contour of both temporary spacers while leaving a gap between the foil and the peripheral part of the first main surface of both semiconductor dies; and subsequently forcing liquefied molding material into the closed mold cavity, the liquefied molding material filling the gap between the foil and the peripheral part of the first main surface of both semiconductor dies.

14. The method of claim 13, further comprising:

after the embedding, removing the additional temporary spacer from the first main surface of the additional semiconductor die to expose the first part of the first main surface of the additional semiconductor die; and after removing both temporary spacers, forming a metallization which extends onto a side of the embedding material facing away from both semiconductor dies and is connected to the first part of the first main surface of the semiconductor die and to the first part of the first main surface of the additional semiconductor die.

15. A method, comprising:

providing a semiconductor die having a first main surface, a second main surface opposite the first main surface, and an edge between the first main surface and the second main surface;

applying a temporary spacer to a first part of the first main surface of the semiconductor die, the first part being positioned inward from a peripheral part of the first main surface;

after applying the temporary spacer, embedding the semiconductor die at least partly in an embedding material, the embedding material covering the edge and the peripheral part of the first main surface of the semiconductor die and contacting a sidewall of the temporary spacer; and after the embedding, removing the temporary spacer from the first main surface of the semiconductor die to expose the first part of the first main surface of the semiconductor die, wherein the first main surface of the semiconductor die includes a metal pad, wherein the temporary spacer at least partly covers the metal pad during the embedding, wherein the metal pad is exposed after the embedding by removing the temporary spacer.

16. The method of claim 15, further comprising:

applying a first additional temporary spacer to an additional metal pad at the first main surface of the semiconductor die, the first additional temporary spacer at least partly covering the additional metal pad during the embedding;

after the embedding, removing the first additional temporary spacer from the additional metal pad of the semiconductor die to expose the additional metal pad; and forming a first metallization on the exposed metal pad and a second metallization on the exposed additional metal pad.

17. The method of claim 16, further comprising:

applying a second additional temporary spacer to the first metallization, and a third additional temporary spacer to the second metallization;

after applying the second and the third temporary spacers, applying an additional embedding material to the side of the embedding material facing away from the semiconductor die;

after applying the additional embedding material, removing the second and the third temporary spacers to expose the part of the first metallization previously covered by the second temporary spacer and to expose the part of the second metallization previously covered by the third temporary spacer; and forming a third metallization on the exposed part of the first metallization, and a fourth metallization on the exposed part of the second metallization.

18. A method, comprising:

providing a semiconductor die having a first main surface, a second main surface opposite the first main surface, and an edge between the first main surface and the second main surface;

applying a temporary spacer to a first part of the first main surface of the semiconductor die, the first part being positioned inward from a peripheral part of the first main surface;

after applying the temporary spacer, embedding the semiconductor die at least partly in an embedding material, the embedding material covering the edge and the peripheral part of the first main surface of the semiconductor die and contacting a sidewall of the temporary spacer;

after the embedding, removing the temporary spacer from the first main surface of the semiconductor die to expose the first part of the first main surface of the semiconductor die;

before the embedding, affixing a side of the temporary spacer facing away from the semiconductor die to a surface of a temporary carrier; and after the embedding, removing the temporary carrier to expose the temporary spacer for removal, wherein the embedding material is a molding compound and the embedding is done using a mold without a foil.

19. A method, comprising:

providing a semiconductor die having a first main surface, a second main surface opposite the first main surface, and an edge between the first main surface and the second main surface;

applying a temporary spacer to a first part of the first main surface of the semiconductor die, the first part being positioned inward from a peripheral part of the first main surface;

after applying the temporary spacer, embedding the semiconductor die at least partly in an embedding material, the embedding material covering the edge and the peripheral part of the first main surface of the semiconductor die and contacting a sidewall of the temporary spacer; and after the embedding, removing the temporary spacer from the first main surface of the semiconductor die to expose the first part of the first main surface of the semiconductor die, wherein the embedding comprises:

in a closed mold cavity, pressing a mold with a foil against the temporary spacer so that the foil contacts a side of the temporary spacer facing away from the semiconductor die and the foil deforms to a contour of the temporary spacer while leaving a gap between the foil and the peripheral part of the first main surface of the semiconductor die; and subsequently forcing liquefied molding material into the closed mold cavity, the liquefied molding material filling the gap between the foil and the peripheral part of the first main surface of the semiconductor die.

20. A method, comprising:

providing a semiconductor die having a first main surface, a second main surface opposite the first main surface, and an edge between the first main surface and the second main surface;

applying a temporary spacer to a first part of the first main surface of the semiconductor die, the first part being positioned inward from a peripheral part of the first main surface;

after applying the temporary spacer, embedding the semiconductor die at least partly in an embedding material, the embedding material covering the edge and the peripheral part of the first main surface of the semiconductor die and contacting a sidewall of the temporary spacer;

after the embedding, removing the temporary spacer from the first main surface of the semiconductor die to expose the first part of the first main surface of the semiconductor die, wherein the first part of the first main surface of the semiconductor die comprises a sensor structure, wherein the temporary spacer at least partly covers a first side of the sensor structure during the embedding, wherein the first side of the sensor structure is exposed after the embedding by removing the temporary spacer;

applying an additional temporary spacer to a second side of the sensor structure opposite the first side, the additional temporary spacer at least partly covering the second side of the sensor structure during the embedding; and after the embedding, removing the additional temporary spacer from the second side of the sensor structure to expose the second side of the sensor structure.

21. A method, comprising:

providing a semiconductor die having a first main surface, a second main surface opposite the first main surface, and an edge between the first main surface and the second main surface;

applying a temporary spacer to a first part of the first main surface of the semiconductor die, the first part being positioned inward from a peripheral part of the first main surface;

after applying the temporary spacer, embedding the semiconductor die at least partly in an embedding material, the embedding material covering the edge and the peripheral part of the first main surface of the semiconductor die and contacting a sidewall of the temporary spacer;

after the embedding, removing the temporary spacer from the first main surface of the semiconductor die to expose the first part of the first main surface of the semiconductor die;

providing an additional semiconductor die having a first main surface, a second main surface opposite the first main surface, and an edge between the first main surface and the second main surface; and applying an additional temporary spacer to a first part of the first main surface of the additional semiconductor die, the first part being positioned inward from a peripheral part of the first main surface, wherein the additional semiconductor die has a different thickness than the semiconductor die, wherein the temporary spacer and the additional temporary spacer accommodate the height difference between the additional semiconductor die and the semiconductor die, so that a combined thickness of the semiconductor die and the temporary spacer is approximately equal to a combined thickness of the additional semiconductor die and the additional temporary spacer.

22. The method of claim 21, wherein the embedding comprises:

in a closed mold cavity, pressing a mold with a foil against both temporary spacers, so that the foil contacts a side of both temporary spacers facing away from both semiconductor dies, and so that the foil deforms to a contour of both temporary spacers while leaving a gap between the foil and the peripheral part of the first main surface of both semiconductor dies; and subsequently forcing liquefied molding material into the closed mold cavity, the liquefied molding material filling the gap between the foil and the peripheral part of the first main surface of both semiconductor dies.

23. The method of claim 22, further comprising:

after the embedding, removing the additional temporary spacer from the first main surface of the additional semiconductor die to expose the first part of the first main surface of the additional semiconductor die; and after removing both temporary spacers, forming a metallization which extends onto a side of the embedding material facing away from both semiconductor dies and is connected to the first part of the first main surface of the semiconductor die and to the first part of the first main surface of the additional semiconductor die.

* * * * *